(12) United States Patent
Barlow et al.

(10) Patent No.: US 10,608,636 B1
(45) Date of Patent: Mar. 31, 2020

(54) SIC JFET LOGIC OUTPUT LEVEL-SHIFTING USING INTEGRATED-SERIES FORWARD-BIASED JFET GATE-TO-CHANNEL DIODE JUNCTIONS

(71) Applicants: Matthew Barlow, Springdale, AR (US); James A. Holmes, Fayetteville, AR (US)

(72) Inventors: Matthew Barlow, Springdale, AR (US); James A. Holmes, Fayetteville, AR (US)

(*) Notice: Subject to any disclaimer, the term of this patent is extended or adjusted under 35 U.S.C. 154(b) by 0 days.

(21) Appl. No.: 16/183,130

(22) Filed: Nov. 7, 2018

Related U.S. Application Data

(60) Provisional application No. 62/582,757, filed on Nov. 7, 2017.

(51) Int. Cl.
*H03K 19/003* (2006.01)
*H03K 19/0185* (2006.01)

(52) U.S. Cl.
CPC ........... *H03K 19/00315* (2013.01); *H03K 19/018507* (2013.01)

(58) Field of Classification Search
None
See application file for complete search history.

(56) References Cited

U.S. PATENT DOCUMENTS

| | | | |
|---|---|---|---|
| 7,688,117 B1 * | 3/2010 | Krasowski | H03K 19/094 326/104 |
| 7,935,601 B1 | 5/2011 | Neudeck | 438/285 |
| 8,416,007 B1 | 4/2013 | Krasowski | 327/430 |
| 8,841,698 B2 | 9/2014 | Neudeck | 257/134 |
| 9,013,002 B1 | 4/2015 | Spry | 23/485 |

* cited by examiner

*Primary Examiner* — Seokjin Kim
(74) *Attorney, Agent, or Firm* — Keisling & Pieper PLC; David B. Pieper

(57) ABSTRACT

An improved electrical circuit for logic output level shifting using SiC JFETs with resistors on the input, inverting, stage and using diode degenerated JFET sources in the output stage.

1 Claim, 4 Drawing Sheets

US 10,608,636 B1

SIC JFET LOGIC OUTPUT LEVEL-SHIFTING USING INTEGRATED-SERIES FORWARD-BIASED JFET GATE-TO-CHANNEL DIODE JUNCTIONS

CROSS-REFERENCE TO RELATED APPLICATIONS

This application claims priority to and is a continuation-in-part of U.S. Patent Application Ser. No. 62/582,757, filed on Nov. 7, 2017 entitled SiC JFET Logic Output Level-Shifting Using Integrated-Series Forward-biased JFET Gate-to-Channel Diode Junctions which is hereby incorporated by reference in its entirety.

STATEMENT REGARDING FEDERALLY SPONSORED RESEARCH OR DEVELOPMENT

This invention was made with government support by the U.S. Department of Energy, advanced data logging electronics for high pressure and temperature subsurface, contact No. DE-SC0017131. The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in electrical circuits. More particularly, the invention relates to improvements particularly suited for JFET circuits. In particular, the present invention relates specifically to a JFET with resistors on the input stage and using diode degenerated JFET sources in the output stage.

2. Description of the Known Art

As will be appreciated by those skilled in the art, electrical circuits are known in various forms. Patents disclosing information relevant to circuit designs include: U.S. Pat. No. 7,688,117, issued to Krasowski on Mar. 30, 2010 entitled N channel JFET based digital logic gate structure; U.S. Pat. No. 7,935,601, issued to Neudeck on May 3, 2011 entitled Method for providing semiconductors having self-aligned ion implant; U.S. Pat. No. 8,416,007, issued to Krasowski on Apr. 9, 2013 entitled N channel JFET based digital logic gate structure; U.S. Pat. No. 8,841,698, issued to Neudeck on Sep. 23, 2014 entitled Method for providing semiconductors having self-aligned ion implant; U.S. Pat. No. 9,013,002, issued to Spry on Apr. 21, 2015 entitled Iridium interfacial stack (IRIS). Each of these patents is hereby expressly incorporated by reference in their entirety.

From these prior references it may be seen that these prior art patents are very limited in their teaching and utilization, and an improved circuit is needed to overcome these limitations.

SUMMARY OF THE INVENTION

The present invention is directed to an improved electrical circuit using a JFET with resistors on the input (inverting) stage and using diode degenerated JFET sources in the output stage. By moving the resistors to the input (inverting) stage and using diode degenerated JFET sources in the output stage, the voltage and temperature sensitivities compensate instead compound. Most importantly, the level shifting action of the diode stack in the output stage exhibits a very low temperature sensitivity. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
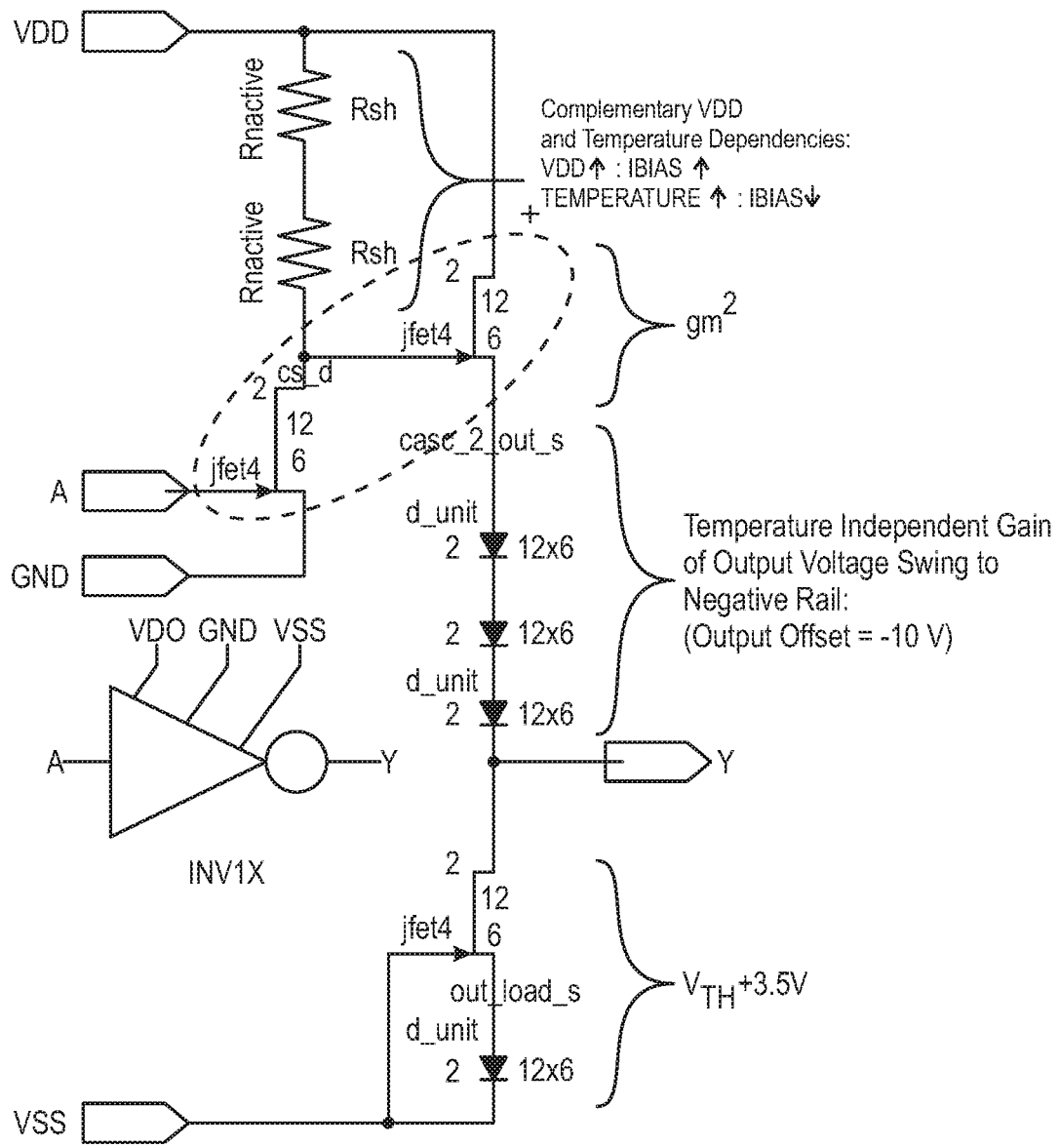
FIG. 1 is a schematic showing source degeneration diodes in the output stage for VTH shift and Temperature Independent Level Shifting.

As shown in FIG. 1 of the drawings, one exemplary embodiment of the present invention is generally shown as a voltage and temperature sensitivity compensating silicon carbide junction gate field-effect transistor circuit. Introduction of the isolated gate-channel diode to the process design kit has enabled development of novel circuit topologies to the speed and dynamic range of logic circuits. Resistively loaded output stages reported in the literature show competing sensitivities to supply voltage and temperature. This means that simply increasing supply voltage does not help compensate for temperature. By moving the resistors to the input, inverting, stage and using diode degenerated JFET sources in the output stage, the voltage and temperature sensitivities compensate instead compound. Most importantly, the level shifting action of the diode stack in the output stage exhibits a very low temperature sensitivity.

Figure 2:
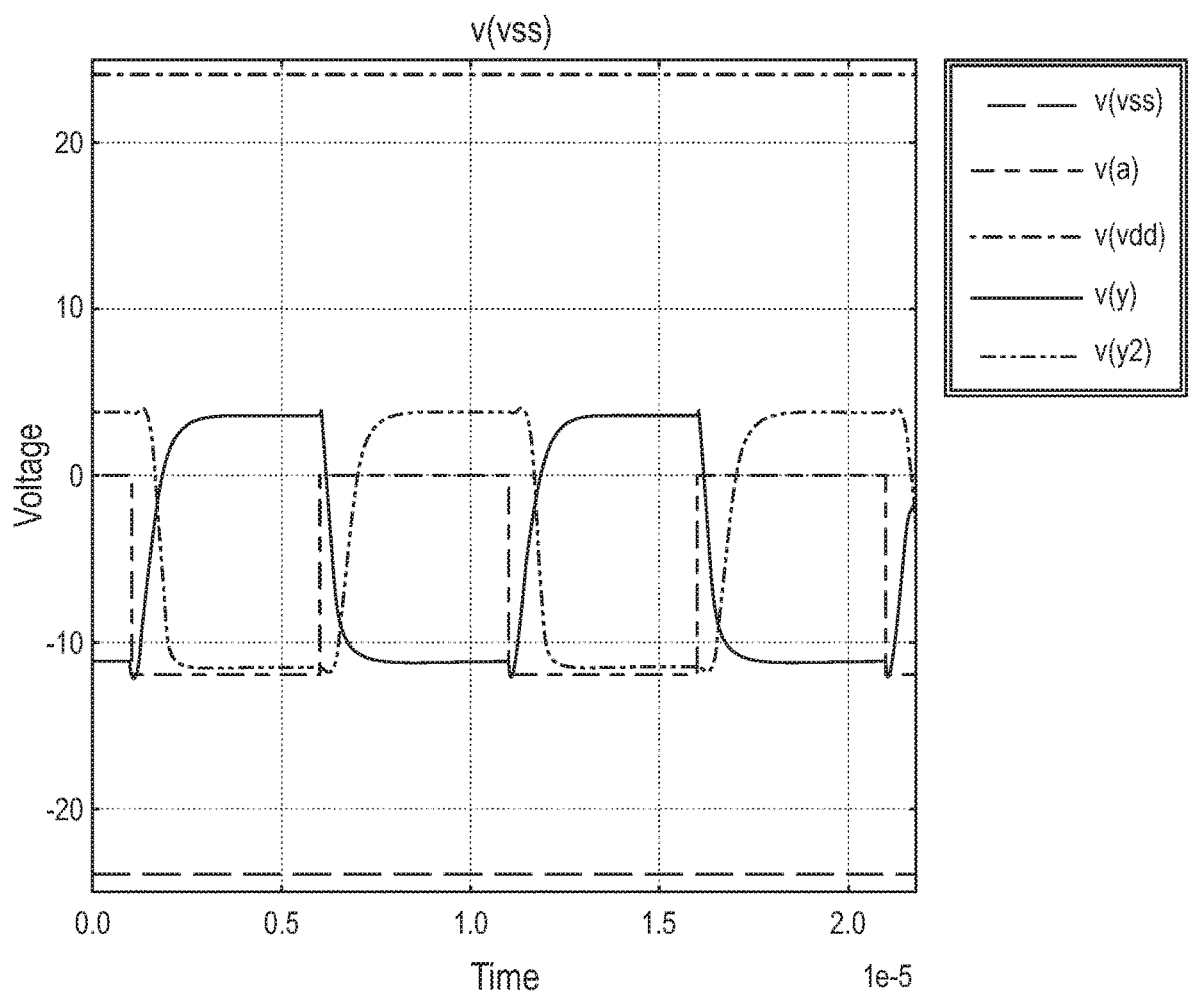
FIG. 2 shows the New Logic Output Stage Topology for Improved Gain and Temperature Stable Level Shifting.

Using the diode topologies results in improved gain and lower temperature sensitivity. The operation of this topology for VDD=+24V and VSS=−24V at the radial performance corner of 30 mm from wafer-center is shown in FIG. 2. The voltage source effect of the level shifting diode improves the pull up capability of the output stage as compared to resistive pullup stages reported in the literature. The improved pull up strength can be seen in the symmetrical rise and fall times of the first inverter output v(y) (green trace) and the second inverter output v(y2) (red trace).

Figure 3:
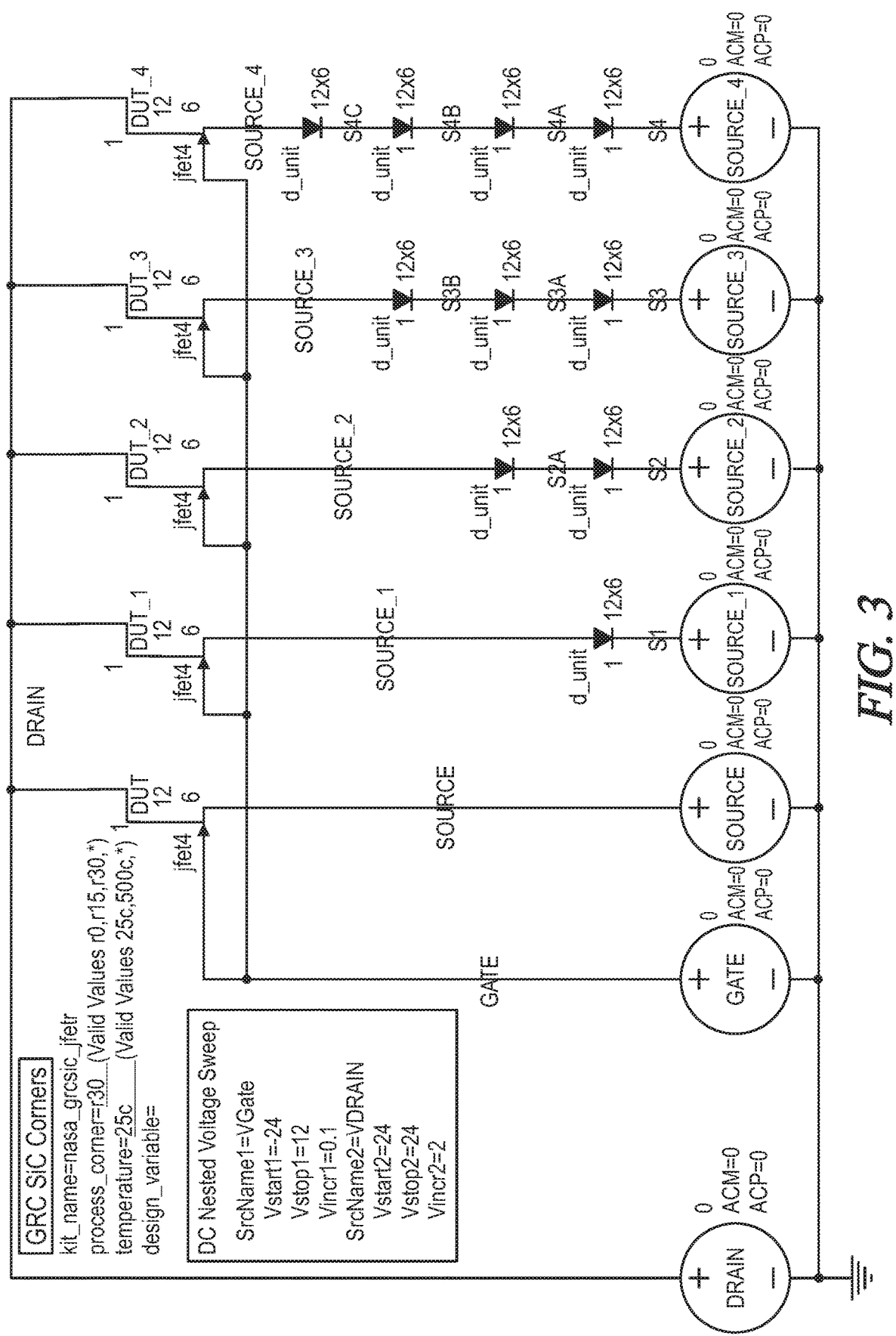
FIG. 3 process design kit Test Bench for JFET VTH Offset by Diode Voltage Source Degeneration FIG. 4 JFET Threshold Voltage Shift Towards Enhancement Mode by Stacking Source Degeneration Diodes (Note: Gate voltage on X-axis is scaled by 10
Figure 4:
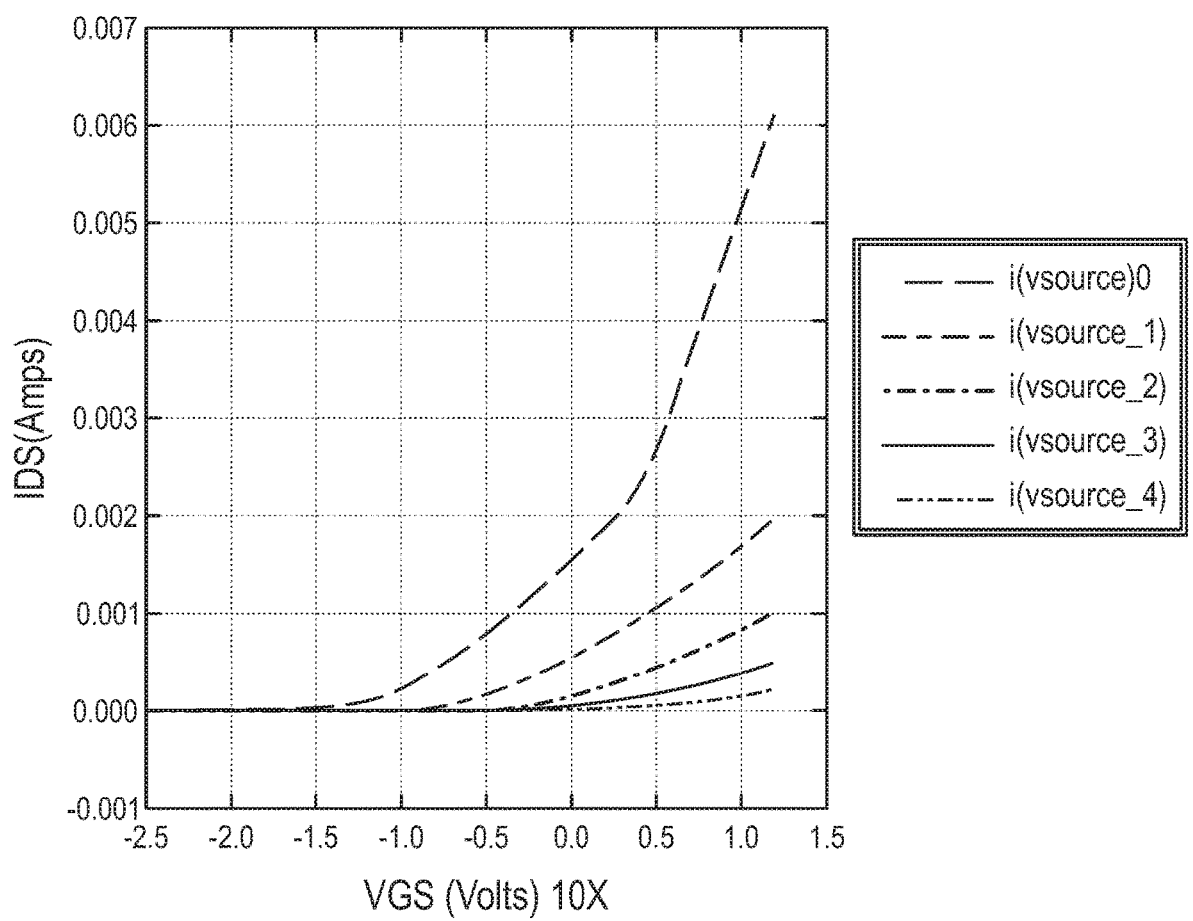

Next, we can look at Source-Degenerated Threshold-Voltage Shift of Depletion-mode SiC JFETs Towards Enhancement-mode Operation Using Integrated-Series Forward-biased JFET Gate-to-Channel Diode Junctions. The threshold voltage (VTH) of the JFET is typically offset by JFET source degeneration using a channel resistor. The high-temperature coefficients of the channel resistor make the VTH variation difficult to manage for temperature scaled designs. The high emission coefficient of the gate-channel diode makes the forward biased diode behave like a temperature insensitive voltage source. Consequently, source-degeneration of the JFET using forward biased diodes provides stepped VTH offsets. The process design test bench shown in FIG. 3 shifts the JFET's VTH toward enhancement mode in steps of VJUNCTION=3.4V as shown in the IDS Vs VGS curves in FIG. 4.

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A silicon carbide junction field effect transistor logic output level shifting circuit receiving a drain input, a source input, and a control signal, the circuit comprising:
   a resistor with a first end and a second end;
   a first junction field effect transistor with a first gate, first drain, and first source;
   the control signal electrically connected across the first gate and the first drain;
   a second junction field effect transistor with a second gate, second drain, and second source;
   the resistor second end electrically connected to the first drain and the second gate;
   the drain input electrically connected to the first end and the first drain;
   a first diode stack having a first anode and a first cathode;
   the first anode electrically connected to the second source;
   a third junction field effect transistor with a third gate, third drain, and third source:
   the first cathode electrically connected to the third drain;
   a second diode stack having a second anode and a second cathode;
   the second anode electrically connected to the third source;
   the source input electrically connected to the third gate and the second cathode.

* * * * *